(12) United States Patent
Chen et al.

(10) Patent No.: US 8,653,641 B2
(45) Date of Patent: Feb. 18, 2014

(54) INTEGRATED CIRCUIT DEVICE

(75) Inventors: Kuan-Neng Chen, Hsinchu (TW);
Ming-Fang Lai, Chiayi County (TW);
Hung-Ming Chen, Hsinchu County (TW)

(73) Assignee: National Chiao Tung University, Taiwan (CN)

( * ) Notice: Subject to any disclaimer, the term of this patent is extended or adjusted under 35 U.S.C. 154(b) by 0 days.

(21) Appl. No.: 13/613,480

(22) Filed: Sep. 13, 2012

(65) Prior Publication Data

US 2013/0169355 A1      Jul. 4, 2013

(30) Foreign Application Priority Data

Jan. 4, 2012   (TW) .............................. 101100310 A

(51) Int. Cl.
*H01L 21/50*   (2006.01)
(52) U.S. Cl.
USPC ....................................................... 257/686
(58) Field of Classification Search
USPC .................. 257/686, 777, 734, 690
See application file for complete search history.

(56) References Cited

U.S. PATENT DOCUMENTS

| 6,359,316 | B1 | 3/2002 | Voss et al. | |
| 6,407,429 | B1 * | 6/2002 | Ko et al. | 257/350 |
| 8,129,811 | B2 * | 3/2012 | Assefa et al. | 257/444 |
| 8,164,171 | B2 * | 4/2012 | Lin et al. | 257/686 |
| 2009/0283898 | A1 * | 11/2009 | Janzen et al. | 257/698 |
| 2009/0297091 | A1 * | 12/2009 | Assefa et al. | 385/14 |
| 2011/0156249 | A1 * | 6/2011 | Chang et al. | 257/737 |
| 2011/0193169 | A1 * | 8/2011 | Assefa et al. | 257/351 |
| 2012/0153437 | A1 * | 6/2012 | Chen et al. | 257/546 |
| 2013/0107075 | A1 * | 5/2013 | Kobayashi et al. | 348/222.1 |

\* cited by examiner

*Primary Examiner* — Nathan Ha
(74) *Attorney, Agent, or Firm* — Morgan, Lewis & Bockius LLP

(57) ABSTRACT

An integrated circuit device includes: a first chip including a first substrate and a main circuit formed on said first chip; a second chip stacked on the first substrate and including a second substrate that is independent from the first substrate, and a protective circuit for protecting the main circuit; and a conductive channel unit extending from the protective circuit and electrically connected to the main circuit.

10 Claims, 5 Drawing Sheets

INTEGRATED CIRCUIT DEVICE

CROSS-REFERENCE TO RELATED APPLICATION

This application claims priority of Taiwanese application no. 101100310, filed on Jan. 4, 2012.

BACKGROUND OF THE INVENTION

1. Field of the Invention

This invention relates to an integrated circuit device, more particularly a three-dimensional integrated circuit device.

2. Description of the Related Art

In general, an integrated circuit (IC) device has an equivalent circuit as shown in FIG. 1. A conventional IC device includes a main circuit 12, a protective circuit 13, and a solder pad unit 14. The main circuit 12 may be a memory or a logic circuit which can perform logic operation. The protective circuit 13 is normally formed around the main circuit 12 to protect the main circuit 12. The solder pad unit 14 is electrically connected to the protective circuit 13 to transmit an external electric signal. The protective circuit 13, based on the position thereof and the design of the IC device, may protect the main circuit 12 from electrostatic damage, may serve as a buffer circuit, or may limit a current passing to the main circuit 12.

A conventional IC device shown in FIG. 2 includes a substrate 11, the main circuit 12 formed on a central portion of the substrate 11, the protective circuit 13 formed on a peripheral portion of the substrate 11 to surround the main circuit 12, and a solder pad unit 14 electrically connected to the main circuit 12 and the protective circuit 13. Because the main circuit 12 and the protective circuit 13 are formed on the same substrate 11, the main circuit 12 and the protective circuit 13 should be spaced apart from each other by a predetermined spacing (S) so as to prevent the main circuit 12 from being adversely affected by a pulse current in the protective circuit 13. The pulse current may be generated from external charges or residual electrostatic charges in the protective circuit 13. Besides, the main circuit 12 may be further provided with a parasitic element for protection against the pulse current from the protective circuit 13. However, if the pulse current passes through an amplifier in the main circuit 12 to produce an unexpectedly large current, it may result in overheating and failure of the IC device.

In order to prevent overheating and failure of the IC device, IC design rules have specified a spacing between the main circuit 12 and the protective circuit is with respect to IC devices having different dimensions, such as 0.13 micrometer, 65 nanometers, 45 nanometers, etc.

However, the IC devices are currently under the trend of miniaturization, and thus preservation of the spacing in the IC device has become a bottleneck in miniaturization of the IC devices.

SUMMARY OF THE INVENTION

Therefore, an object of the present invention is to provide an integrated circuit device that has a reduced area.

Accordingly, an integrated circuit device of this invention comprises: a first chip including a first substrate and a main circuit formed on the first substrate; a second chip stacked on the first chip and including a second substrate that is independent from the first substrate, and a protective circuit for protecting the main circuit, the protective circuit being formed on the second substrate; and a conductive channel unit extending from the protective circuit and electrically connected to the main circuit.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
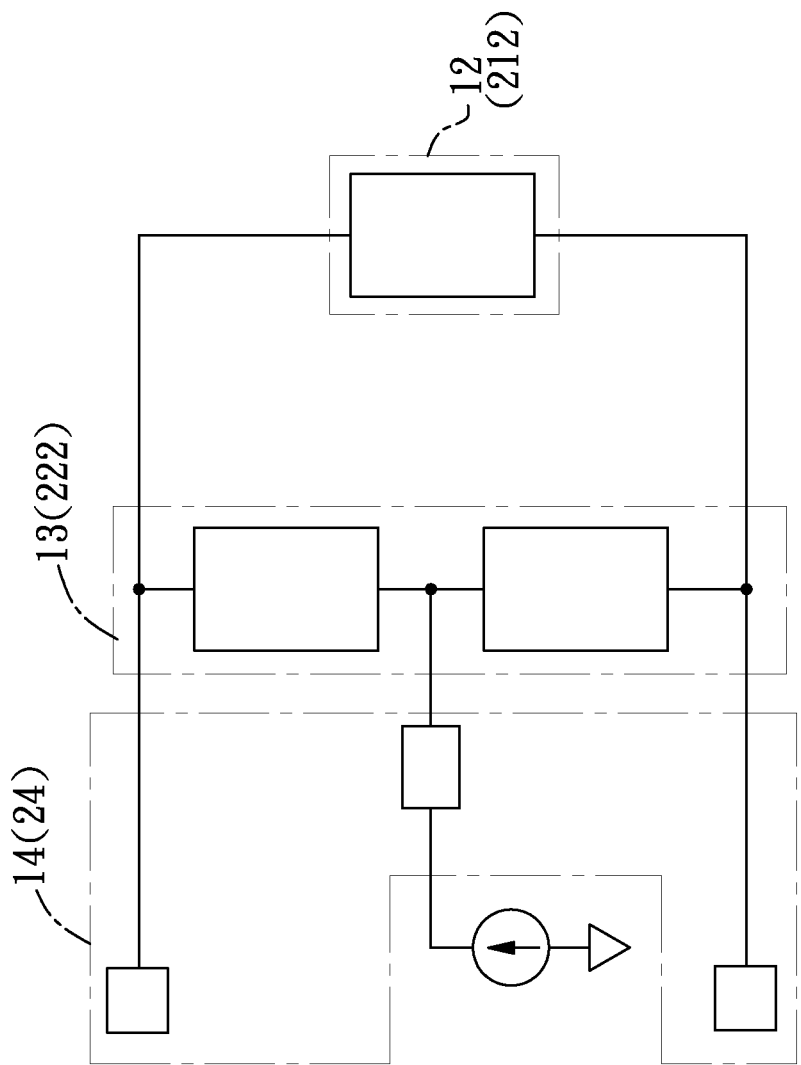
FIG. 1 is an equivalent circuit diagram of an integrated circuit device.
Figure 2:
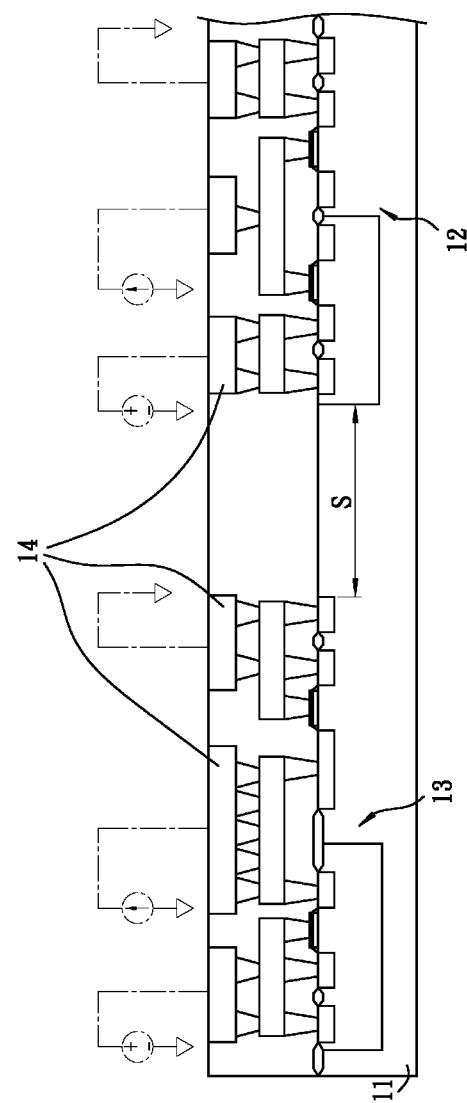
FIG. 2 is a schematic diagram of a conventional integrated circuit device.

Before the present invention is described in greater detail, it should be noted herein that like elements are denoted by the same reference numerals throughout the disclosure.

Figure 3:
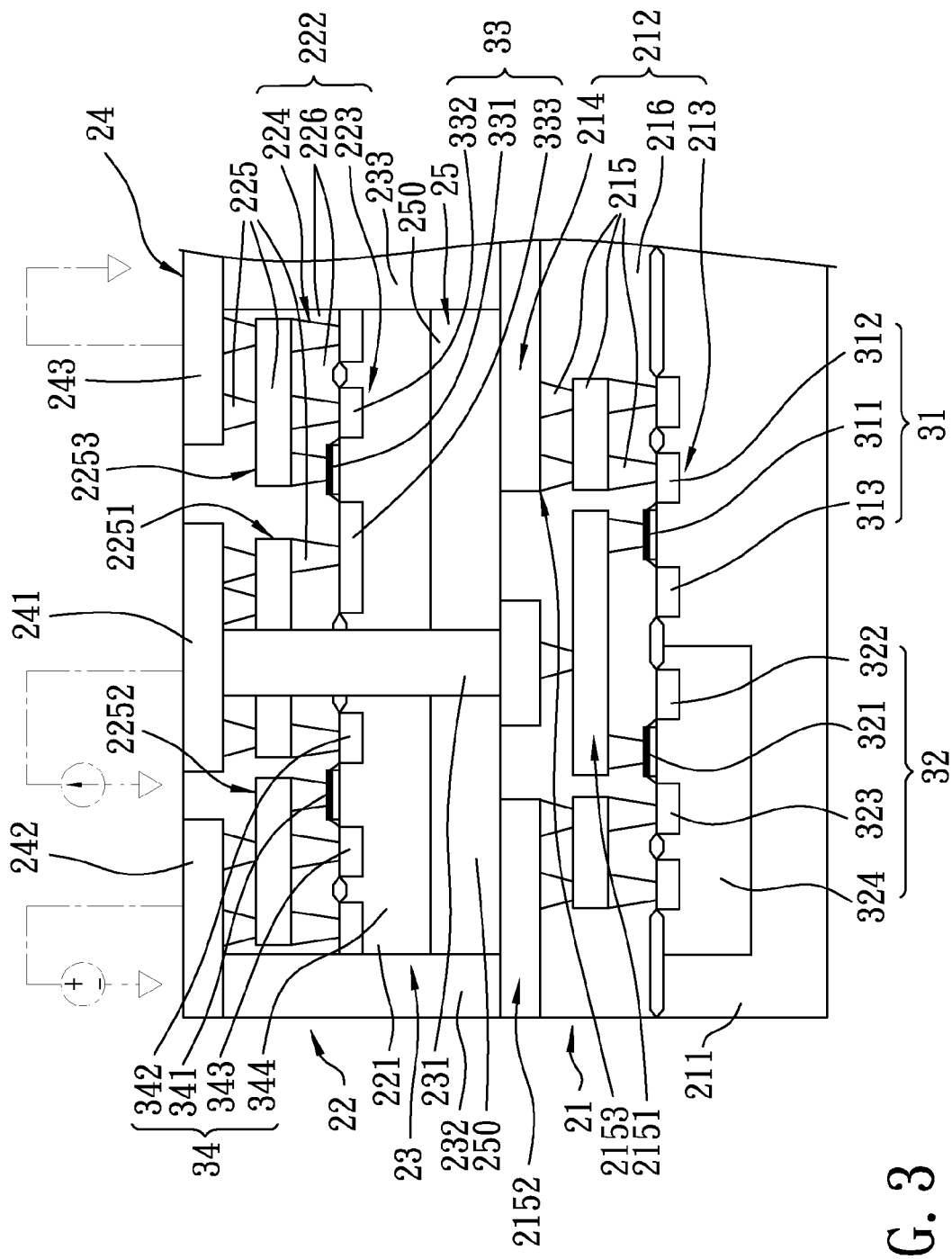
FIG. 3 is a schematic diagram of the first preferred embodiment of an integrated circuit device according to this invention.

Referring to FIG. 3, the first preferred embodiment of an integrated circuit (IC) device according to this invention is shown to include a first chip 21, a second chip 22, and a conductive channel unit 23. Because the IC device of this invention has the same equivalent circuit as that of the conventional IC device, and thus, FIG. 1 can also represent the equivalent circuit of the IC device of this invention.

The first chip 21 includes a first substrate 211 and a main circuit 212 formed on the first substrate 211. In this embodiment, the first substrate 211 is mainly made of a p-type silicon wafer material. However, the material of the first substrate 211 should not be limited to the silicon wafer material, and may be a Group 111-V wafer material such as gallium nitride.

The main circuit 212 is formed on a top side of the first substrate 211, and includes a first semiconductor structure 213, a first wiring structure 214, and a first dielectric layer 216. The first semiconductor structure 213 is formed on the first substrate 211. The first wiring structure 214 extends from the first semiconductor structure 213 along a direction oppositely of the first substrate 211, is electrically connected to the conductive channel unit 23, and includes a plurality of first wirings 215 each of which is made of metal. The first dielectric layer 216 is formed on the first semiconductor structure 213 and disposed among the first wirings 215 of the first wiring structure 214, and is mainly made of an electrically insulating material.

In the first preferred embodiment, the first semiconductor structure 213 of the main circuit 212 has an n-type transistor 31 and a p-type transistor 32 electrically connected to the n-type transistor 31. The n-type transistor 31 has a gate electrode 311, a source electrode 312, and a drain electrode 313. The source electrode 312 and the drain electrode 313 are n-doped, and are respectively disposed at two opposite sides of the gate electrode 311. The p-type transistor 32 has an n-type well region 324 disposed proximate to the n-type transistor 31, a gate electrode 321 disposed on the well region 324, a source electrode 323, and a drain electrode 322. The source electrode 323 and the drain electrode 322 are p-doped, and are respectively formed in the well region 324 at two opposite sides of the gate electrode 321. The drain electrode 313 of the n-type transistor 31 and the drain electrode 322 of the p-type transistor are disposed adjacent to each other and are electrically connected to each other.

The first wirings 215 are divided into first to three portions 2151, 2152, 2153. The first portion 2151 is electrically connected to the gate electrode 311 of the n-type transistor 31 and the gate electrode 321 of the p-type transistor 32. The second portion 2152 is electrically connected to the source electrode 323 of the p-type transistor 32. The third portion 2153 is electrically connected to the source electrode 312 of the n-type transistor 31.

The second chip 22 is stacked over the main circuit 212 oppositely of the first substrate 211, and includes a second substrate 221 independent from the first substrate 211, and a protective circuit 222 for protecting the main circuit 212. In this embodiment, the second substrate 221 is mainly made of a p-type silicon wafer material. However, the material of the second substrate 221 should not be limited to the silicon wafer material, and may be a Group III-V wafer material (such as gallium nitride) or a stack of layers of silicon-silicon oxide-silicon.

The protective circuit 222 is formed on a top side of the second substrate 221, and includes a second semiconductor structure 223, a second wiring structure 224, and a second dielectric layer 226. The second semiconductor structure 223 is formed on the second substrate 221. The second wiring structure 224 extends from the second semiconductor structure 223 along a direction oppositely of the second substrate 221, is electrically connected to the conductive channel unit 23, and includes a plurality of second wirings 225 each of which is made of metal. The second dielectric layer 226 is formed on the second semiconductor structure 223 and disposed among the second wirings 225 of the second wiring structure 224, and is mainly made of an electrically insulating material.

In the first preferred embodiment, the second semiconductor structure 223 of the protective circuit 222 has an n-type transistor 33 and a p-type transistor 34 electrically connected to the n-type transistor 33. The n-type transistor 33 has a gate electrode 331, a source electrode 332 and a drain electrode 333. The source electrode 332 and the drain electrode 333 are n-doped, and are respectively disposed at two opposite sides of the gate electrode 331. The p-type transistor 34 has an n-type well region 344 disposed adjacent to the n-type transistor 33, a gate electrode 341 disposed on the well region 344, a source electrode 343, and a drain electrode 342. The source electrode 343 and the drain electrode 342 are p-doped, and are respectively formed in the well region 344 at two opposite sides of the gate electrode 341. The drain electrode 333 of the n-type transistor 33 is electrically connected to the drain electrode 342 of the p-type transistor 34.

The second wirings 225 are divided into first to three portions 2251, 2252, 2253. The first portion 2251 is electrically connected to the drain electrode 333 of the n-type transistor 33 and the drain electrode 342 of the p-type transistor 32. The second portion 2252 is electrically connected to the gate electrode 341 and the source electrode 343 of the p-type transistor 32. The third portion 2253 is electrically connected to the gate electrode 331 and the source electrode 332 of the n-type transistor 33.

The conductive channel unit 23 extends from the protective circuit 222, and is disposed to establish direct electrical contact with the first wiring structure 214 of the main circuit 212. In the first preferred embodiment, the conductive channel unit 23 is formed by virtue of a through silicon via (TSV) technique. In such technique, the first and second chips 21, 22 are etched to form a through hole, followed by filling conductive material into the through hole. In this embodiment, the conductive channel unit 23 includes first to third conductive channels 231, 232, 233 that are spaced apart from each other and that are made of metal. The first conductive channel 231 electrically connects the first portion 2151 of the first wirings 215 to the first portion 2251 of the second wirings 225. The second conductive channel 232 electrically connects the second portion 2152 of the first wirings 215 to the second portion 2252 of the second wirings 225. The third conductive channel 233 electrically connects the third portion 2153 of the first wirings 215 to the third portion 2253 of the second wirings 225.

Preferably, the IC device further includes a coupling unit 25 that is made of silicon oxide and that couples the first and second chips 21, 22 together. In the first preferred embodiment, the first to third conductive channels 231, 232, 233 are disposed to establish direct electrical contact with the first to third portions 2151, 2152, 2153 of the first wirings 215, respectively. The coupling unit 25 has two coupling members 250, each of which is disposed between the main circuit 212 and the second substrate 221, and each of which is disposed between a respective adjacent pair of the first to third conductive channels 231, 232, 233.

In detail, each of the coupling members 250 couples a portion of a top surface of the first dielectric layer 216 oppositely of the first substrate 211 to a portion of a bottom surface of the second substrate 221 oppositely of the protective circuit 222, thereby securely bonding the first chip 21 to the second chip 22.

In the first preferred embodiment, the IC device further includes a solder pad unit 24 for connecting to an external power source and disposed to establish direct electrical contact with the second wiring structure 224 opposite to the second substrate 221.

In this embodiment, the solder pad unit 24 includes an input/output pad (I/O pad) 241, a power pad (Vdd pad) 242, and a ground pad (Vss pad) 243. The I/O pad 241 is electrically connected to the first conductive channel 231, and is adapted to be connected to an external signal source for transmitting an electrical signal. The power pad 242 is electrically connected to the second conductive channel 232, and is adapted to be connected to a positive voltage node for transmitting power. The ground pad 243 is electrically connected to the third conductive channel 233 and is adapted to be connected to a reference voltage node.

In the main circuit 212 of the first chip 21, the n-type transistor 31 and the p-type transistor 32 are connected in series. The gate electrodes 311 and 321 of the n-type transistor 31 and the p-type transistor 32 are controlled by an I/O signal transmitted from the I/O pad 241. In the protective circuit 222 of the second chip 22, the n-type transistor 33 and the p-type transistor 34 are connected in series. The gate electrodes 333 and 342 of the n-type transistor 33 and the p-type transistor 34 are controlled by an I/O signal transmitted from the I/O pad 241 so as to adjust a potential difference between the gate electrode 341/the source electrode 343 and the drain electrode 342, and a potential difference between the gate electrode 331/the source electrode 332 and the drain electrode 333.

In an ideal operation of a part of the main circuit 212, a positive voltage is transmitted from the power pad 242 to the p-type transistor 32 of the main circuit 212, the ground pad 243 grounds the source electrode 312 of the n-type transistor 31, and the operation of the n-type transistor 31 or the p-type transistor 32 is controlled by the I/O signal transmitted from the I/O pad 241. At the same time, in a part of the protective circuit 222, the positive voltage from the power pad 242 is transmitted to the p-type transistor 34, the ground pad 243 grounds the source electrode 332 of the n-type transistor 33, and the operation of the n-type transistor 33 or the p-type transistor 34 is controlled by the I/O signal transmitted from the I/O pad 241. As such, positive charges accumulated in the solder pad unit 24 can be pulled up through the protective circuit 222 and be guided to the external surroundings through the power pad 242. At this moment, the protective circuit 222 serves as a pull up circuit. On the other hand, negative charges accumulated between the solder pad unit 24 and the protective circuit 222 can be pulled down and be guided to the external surroundings. At this moment, the protective circuit 222 serves as a pull down circuit. Accordingly, the main circuit 212 of the first chip 21 can be protected from being damaged by the charges.

During normal operation of an IC device, an n-p-n-p parasitic thyristor is inevitably produced between the n-type transistor 31 and the p-type transistor 32 in the main circuit 212 of the first chip 21. When a pulse current flows to the main circuit 212, the n-p-n-p parasitic thyristor may serve as an amplifier to produce an unexpectedly large current through a latch-up effect, thereby resulting in overheating and failure of the IC device. With the protective circuit 222 of the second chip 22, parasitic diodes are generated to prevent the IC device of this invention from being destroyed by the n-p-n-p parasitic thyristor.

In the IC device of this invention, when the pulse current is generated due to the presence of electrostatic charges, the pulse current will not flow to the main circuit 212 since the main circuit 212 and the protective circuit 222 are respectively formed on different substrates (i.e., the first and second substrates 211, 221). Thus, the main circuit 212 can avoid interference of the pulse current and maintain normal operation, and the problems of overheating and failure of the IC device due to an insufficient spacing between the main circuit 212 and the protective circuit 222 can be overcome. Besides, by stacking the second chip 22 (the protective circuit 222) over the first chip 21 (the main circuit 212), an occupied area of the IC device in an electronic apparatus can be greatly reduced.

Figure 4:
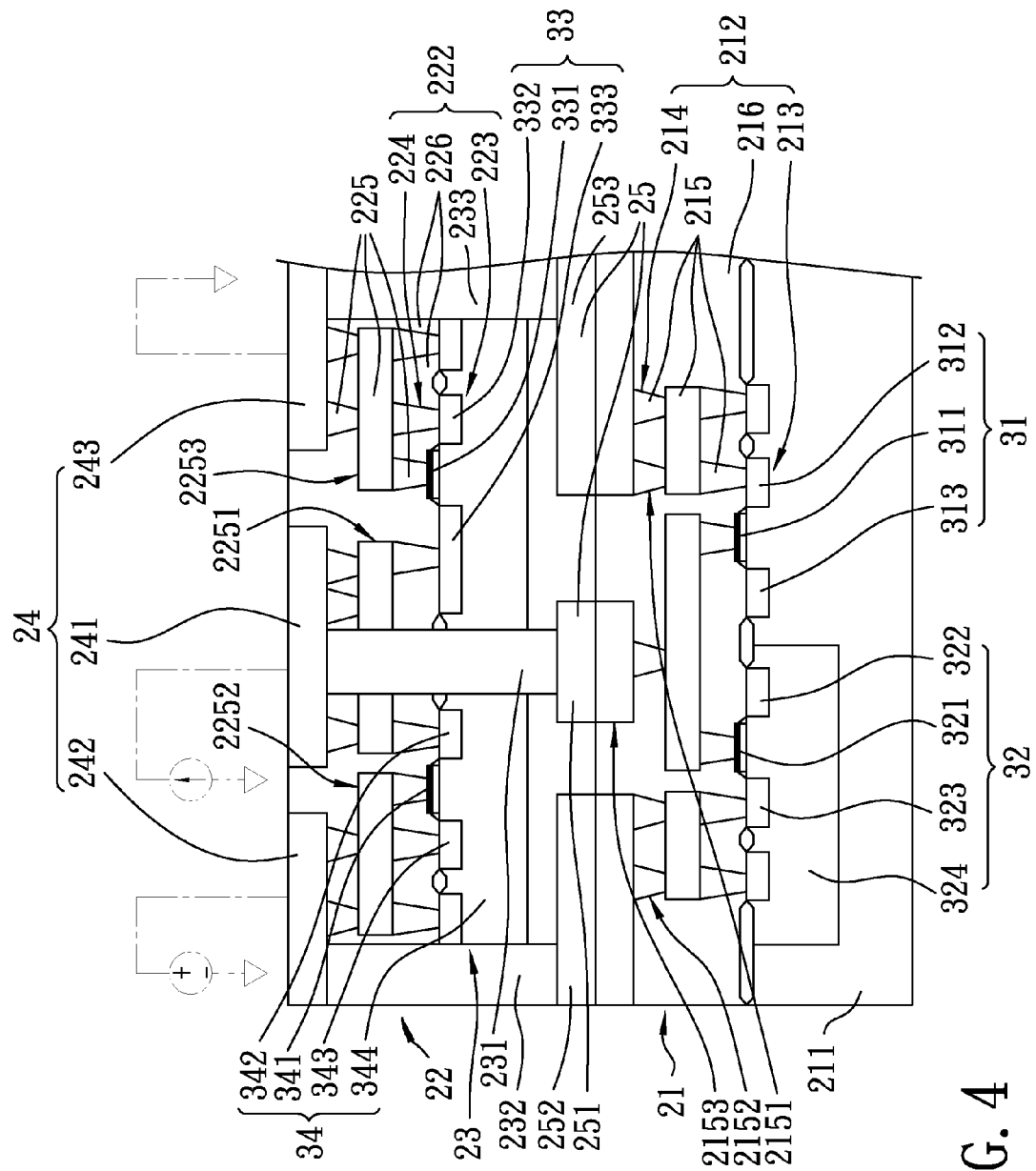
FIG. 4 is a schematic diagram of the second preferred embodiment of an integrated circuit device according to this invention.

It should be noted that, in this embodiment, the protective circuit 222 is exemplified as a device for preventing latch-up, but should not be limited thereto. The protective circuit 222 can be any device for different protection purposes, and may be an n-type transistor, a p-type transistor, or a diode. The main circuit 212 may also be a transistor, a diode, or a resistor. FIG. 4 illustrates the second preferred embodiment of the integrated circuit device according to this invention. The second preferred embodiment differs from the first preferred embodiment in that the coupling unit is made of metal, and electrically connects the conductive channel unit 23 to the first wiring structure 214. The coupling unit 25 includes first to third coupling members 251, 252 and 253. The first to three portions 2151, 2152 and 2153 of the first wirings 215 are respectively and electrically connected to the first to third conductive channels 231, 232 and 233 of the conductive channel unit 23 through the first to third coupling members 251, 252 and 253, respectively.

Figure 5:
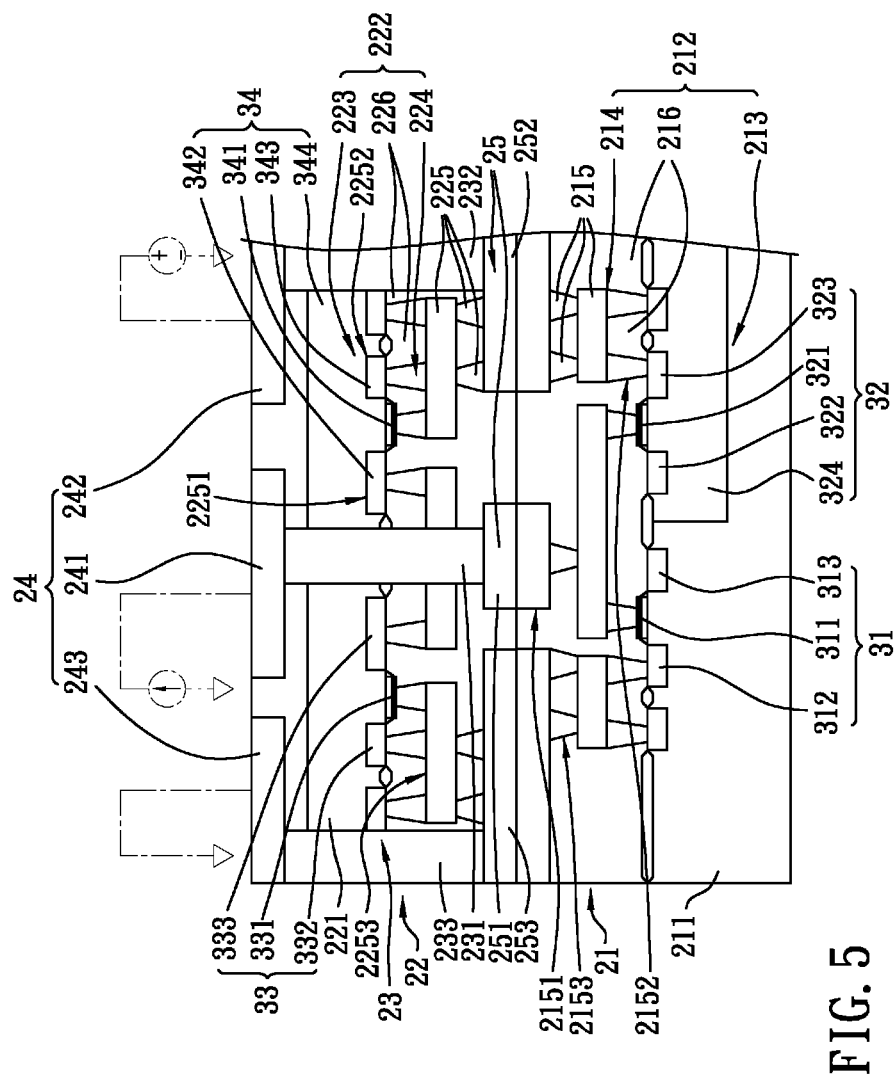
FIG. 5 is a schematic diagram of the third preferred embodiment of an integrated circuit device according to this invention.

FIG. 5 illustrates the integrated circuit device of the third preferred embodiment according to this invention. The third preferred embodiment differs from the second preferred embodiment in that the main circuit 212 is formed on a top side of the first substrate 211, and the protective circuit 222 is formed on a bottom side of the second substrate 221. Besides, the solder pad unit 24 is disposed on the second substrate 221 oppositely of the second wiring structure 224, and is electrically connected to the main circuit 212 and the protective circuit 222 through the conductive channel unit 23. The second wiring structure 224 is electrically connected to the solder pad unit 24 through the conductive channel unit 23.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. An integrated circuit device comprising:
   a first chip including a first substrate and a main circuit formed on said first substrate;
   a second chip stacked on said first chip and including a second substrate that is independent from said first substrate, and a protective circuit for protecting said main circuit, said protective circuit being formed on said second substrate;
   a conductive channel unit extending from said protective circuit and electrically connected to said main circuit; and
   a solder pad unit for connecting to an external power source;
   wherein said main circuit of said first chip includes at least one transistor having a gate electrode, a drain electrode and a source electrode, said protective circuit of said second chip including at least one transistor having a drain electrode and a source electrode, said solder pad unit including an input/output pad that is electrically connected to said gate electrode of said at least one transistor of said main circuit and to one of said drain electrode and said source electrode of said at least one transistor of said protective circuit, said source electrode and said drain electrode of said at least one transistor of said main circuit being not directly and electrically connected to said input/output pad.

2. The integrated circuit device of claim 1, wherein:
   said main circuit includes a first semiconductor structure having at least one transistor and formed on said first substrate, a first wiring structure extending from said first semiconductor structure and electrically connected to said conductive channel unit, and a first dielectric layer formed on said first semiconductor structure and disposed among said first wiring structure; and
   said protective circuit includes a second semiconductor structure having said at least one transistor and formed on said second substrate, a second wiring structure extending from said second semiconductor structure and electrically connected to said conductive channel unit, and a second dielectric layer formed on said second semiconductor structure and disposed among said second wiring structure.

3. The integrated circuit device of claim 1, wherein said conductive channel unit is made of metal.

4. The integrated circuit device of claim 2, wherein each of said first and second dielectric layers is made of an electrically insulating material.

5. The integrated circuit device of claim 2, further comprising a coupling unit made of silicon oxide and coupling said first and second chips together, said second chip being stacked over said main circuit oppositely of said first substrate, said conductive channel unit being disposed to establish direct electrical contact with said first wiring structure, said coupling unit being disposed between said main circuit and said second substrate.

6. The integrated circuit device of claim 2, further comprising a coupling unit made of metal, coupling said first and second chips together, and electrically connecting said conductive channel unit to said first wiring structure.

7. The integrated circuit device of claim 2, wherein said main circuit is formed on a top side of said first substrate, and said protective circuit is formed on a top side of said second substrate.

8. The integrated circuit device of claim 7, wherein said solder pad unit is disposed to establish direct electrical contact with said second wiring structure opposite to said second substrate.

9. The integrated circuit device of claim 2, wherein said main circuit is formed on a top side of said first substrate, and said protective circuit is formed on a bottom side of said second substrate.

10. The integrated circuit device of claim 9, wherein said solder pad unit is disposed on said second substrate oppositely of said second wiring structure, said second wiring structure being electrically connected to said solder pad unit through said conductive channel unit.

* * * * *